(12) United States Patent
Derderian et al.

(10) Patent No.: US 8,435,886 B2
(45) Date of Patent: May 7, 2013

(54) METHOD AND SYSTEM FOR BINDING HALIDE-BASED CONTAMINANTS

(75) Inventors: Garo J. Derderian, Boise, ID (US); Cem Basceri, Boise, ID (US); Donald L. Westmoreland, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/541,435

(22) Filed: Jul. 3, 2012

(65) Prior Publication Data

US 2012/0276750 A1 Nov. 1, 2012

Related U.S. Application Data

(62) Division of application No. 13/041,227, filed on Mar. 4, 2011, now Pat. No. 8,216,377, which is a division of application No. 11/218,773, filed on Sep. 1, 2005, now Pat. No. 7,922,818, which is a division of application No. 10/230,592, filed on Aug. 29, 2002, now Pat. No. 7,311,942.

(51) Int. Cl.
| | |
|---|---|
| *C23C 16/06* | (2006.01) |
| *C23C 16/08* | (2006.01) |
| *H01L 21/3205* | (2006.01) |
| *H01L 21/44* | (2006.01) |
| *H01L 21/4763* | (2006.01) |
| *H01L 21/31* | (2006.01) |
| *H01L 21/469* | (2006.01) |

(52) U.S. Cl.
USPC ............ 438/648; 427/255.36; 427/255.39; 427/255.391; 438/656; 438/683; 438/685; 438/785; 118/715

(58) Field of Classification Search .......... 118/715; 427/255.36, 255.39, 255.391; 438/648, 656, 438/683, 685, 785, FOR. 352
See application file for complete search history.

(56) References Cited

U.S. PATENT DOCUMENTS

| | | | |
|---|---|---|---|
| 4,696,833 A | | 9/1987 | Monnig et al. |
| 4,957,777 A | * | 9/1990 | Ilderem et al. ............... 438/677 |
| 5,302,240 A | * | 4/1994 | Hori et al. .................... 438/719 |
| 5,357,130 A | | 10/1994 | Scholz et al. |
| 5,377,429 A | | 1/1995 | Sandhu et al. |
| 5,393,565 A | | 2/1995 | Suzuki et al. |
| 5,429,991 A | * | 7/1995 | Iwasaki et al. ............... 438/653 |
| 5,571,572 A | | 11/1996 | Sandhu |
| 5,595,784 A | | 1/1997 | Kaim et al. |
| 5,633,036 A | * | 5/1997 | Seebauer et al. ........... 427/126.5 |
| 5,693,377 A | | 12/1997 | Westmoreland et al. |
| 5,698,022 A | | 12/1997 | Glassman et al. |
| 5,700,519 A | | 12/1997 | Lam |
| 5,745,990 A | | 5/1998 | Lee et al. |
| 5,824,365 A | | 10/1998 | Sandhu et al. |
| 5,900,063 A | * | 5/1999 | Boswell et al. ......... 118/723 VE |
| 5,902,651 A | | 5/1999 | Westmoreland et al. |

(Continued)

FOREIGN PATENT DOCUMENTS

FI 19992235 4/2001

*Primary Examiner* — Rudy Zervigon
(74) *Attorney, Agent, or Firm* — Fletcher Yoder, P.C.

(57) ABSTRACT

A method and apparatus are presented for reducing halide-based contamination within deposited titanium-based thin films. Halide adsorbing materials are utilized within the deposition chamber to remove halides, such as chlorine and chlorides, during the deposition process so that contamination of the titanium-based film is minimized. A method for regenerating the halide adsorbing material is also provided.

11 Claims, 5 Drawing Sheets

U.S. PATENT DOCUMENTS

| | | | |
|---|---|---|---|
| 5,962,084 A * | 10/1999 | Miyamoto et al. | 427/576 |
| 5,968,379 A | 10/1999 | Zhao et al. | |
| 6,022,587 A | 2/2000 | Hey et al. | |
| 6,099,651 A | 8/2000 | Sajoto et al. | |
| 6,110,543 A * | 8/2000 | DeSantolo et al. | 427/578 |
| 6,136,670 A * | 10/2000 | Blalock et al. | 438/471 |
| 6,143,192 A | 11/2000 | Westmoreland | |
| 6,143,362 A | 11/2000 | Sandhu et al. | |
| 6,162,499 A | 12/2000 | Sandhu et al. | |
| 6,174,750 B1 | 1/2001 | Onabe et al. | |
| 6,174,809 B1 * | 1/2001 | Kang et al. | 438/682 |
| 6,184,136 B1 | 2/2001 | Iyer et al. | |
| 6,201,219 B1 | 3/2001 | Sandhu et al. | |
| 6,206,971 B1 | 3/2001 | Umotoy et al. | |
| 6,284,316 B1 | 9/2001 | Sandhu et al. | |
| 6,332,926 B1 | 12/2001 | Pfaendtner et al. | |
| 6,364,954 B2 | 4/2002 | Umotoy et al. | |
| 6,436,820 B1 | 8/2002 | Hu et al. | |
| 6,444,265 B1 * | 9/2002 | Froschle et al. | 427/255.38 |
| 6,451,214 B1 | 9/2002 | Westmoreland | |
| 6,454,957 B1 | 9/2002 | Westmoreland | |
| 6,458,416 B1 | 10/2002 | Derderian et al. | |
| 6,458,701 B1 | 10/2002 | Chae et al. | |
| 6,548,389 B2 * | 4/2003 | Moriwaki et al. | 438/592 |
| 6,849,300 B2 * | 2/2005 | Kil et al. | 427/255.31 |
| 6,888,252 B2 | 5/2005 | Derraa | |
| 6,897,960 B2 | 5/2005 | DiMeo, Jr. et al. | |
| 6,902,763 B1 * | 6/2005 | Elers et al. | 427/250 |
| 6,986,914 B2 * | 1/2006 | Elers et al. | 427/255.23 |
| 7,198,820 B2 * | 4/2007 | Harkonen et al. | 427/249.17 |
| 7,311,942 B2 * | 12/2007 | Derderian et al. | 427/255.391 |
| 7,329,590 B2 * | 2/2008 | Elers et al. | 438/473 |
| 7,410,666 B2 * | 8/2008 | Elers et al. | 427/97.7 |
| 7,749,871 B2 * | 7/2010 | Elers et al. | 438/473 |
| 7,993,987 B1 * | 8/2011 | Knarr et al. | 438/143 |
| 2003/0082296 A1 * | 5/2003 | Elers et al. | 427/96 |
| 2003/0199152 A1 * | 10/2003 | Derraa | 438/471 |
| 2004/0043228 A1 * | 3/2004 | Derderian et al. | 428/446 |
| 2005/0044802 A1 * | 3/2005 | Bellman et al. | 51/307 |
| 2005/0106877 A1 * | 5/2005 | Elers et al. | 438/689 |
| 2005/0214533 A1 * | 9/2005 | Shimosaki et al. | 428/375 |
| 2006/0078679 A1 * | 4/2006 | Elers et al. | 427/248.1 |
| 2006/0079090 A1 * | 4/2006 | Elers et al. | 438/685 |
| 2009/0098421 A1 * | 4/2009 | Mills | 429/17 |

* cited by examiner

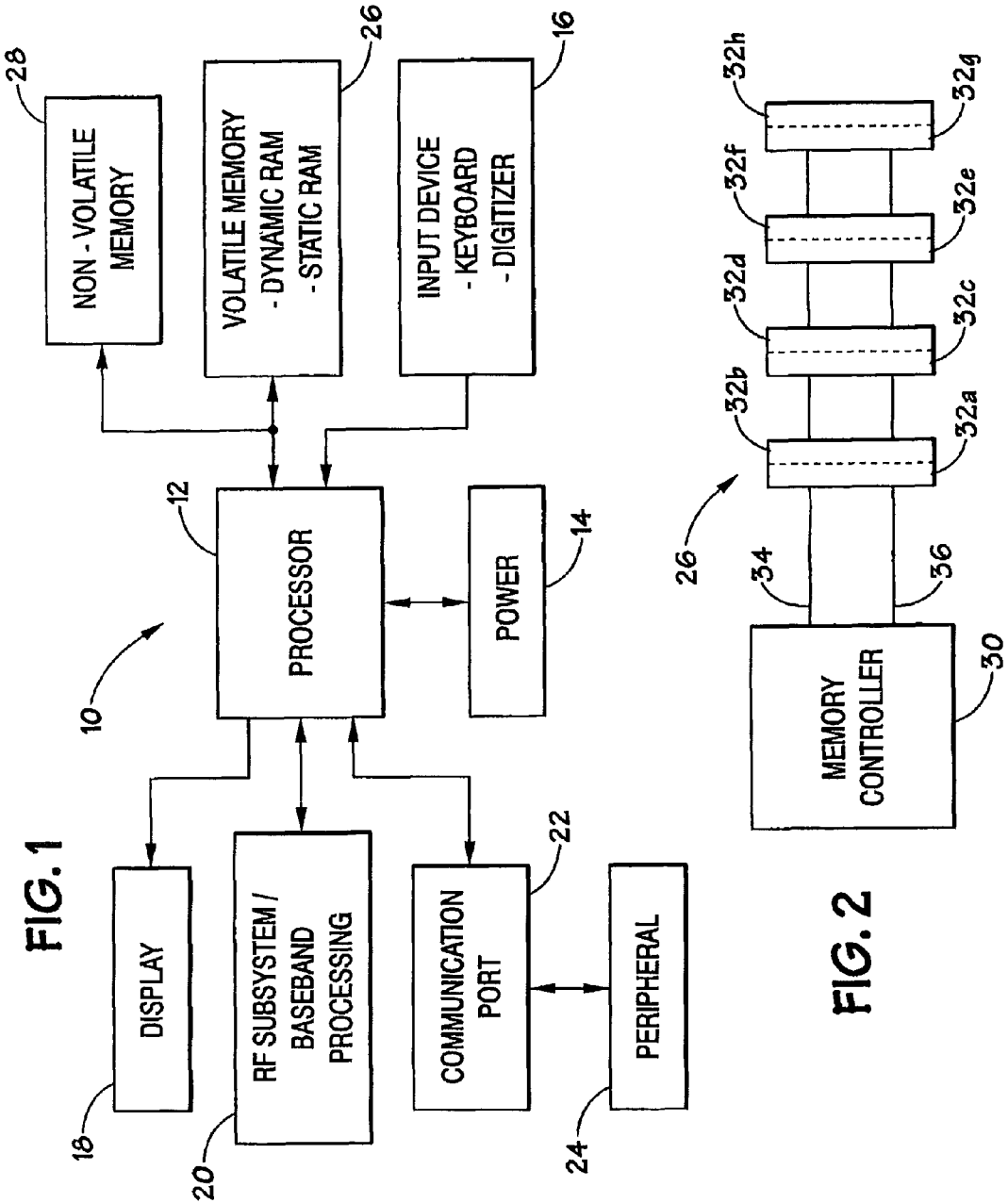

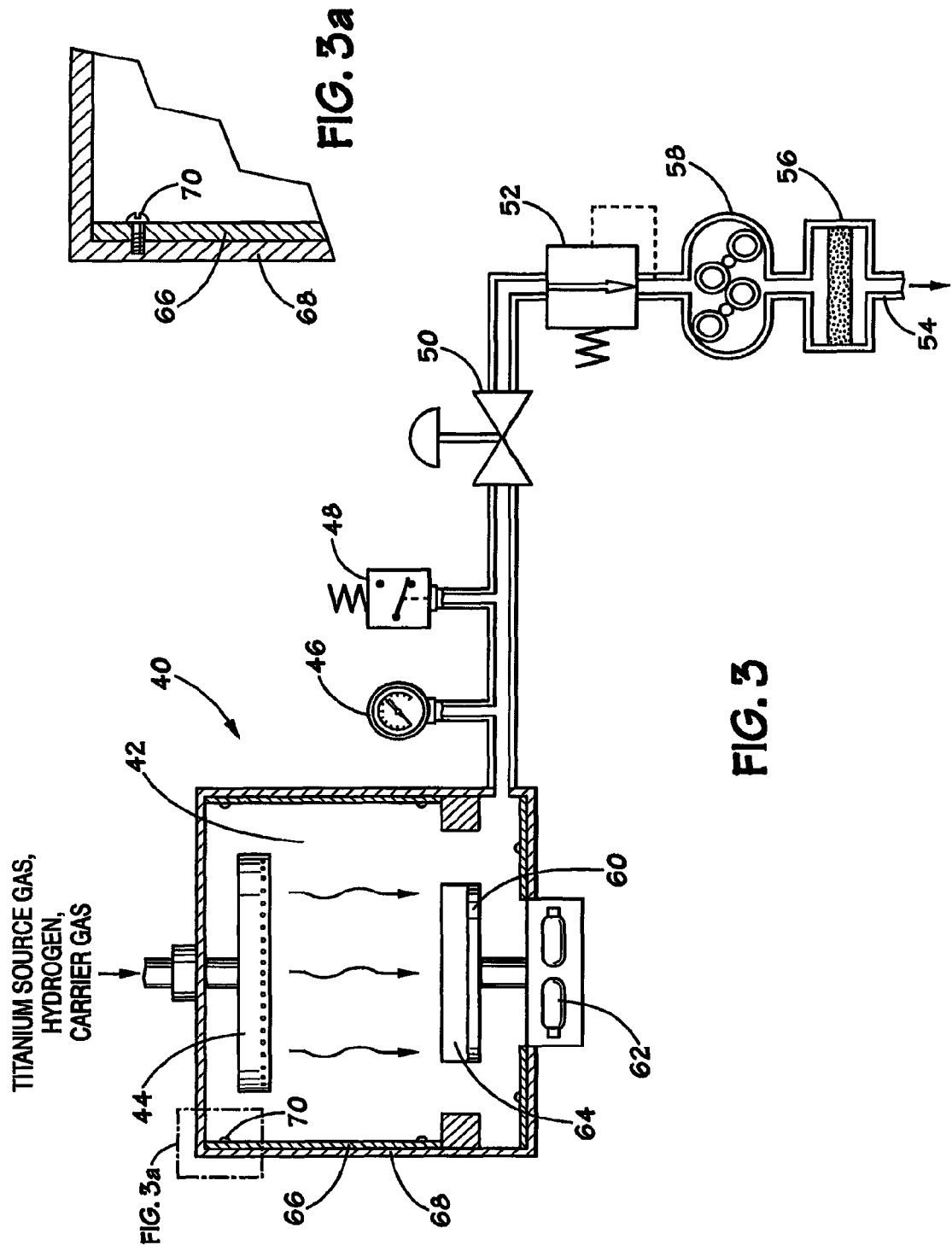

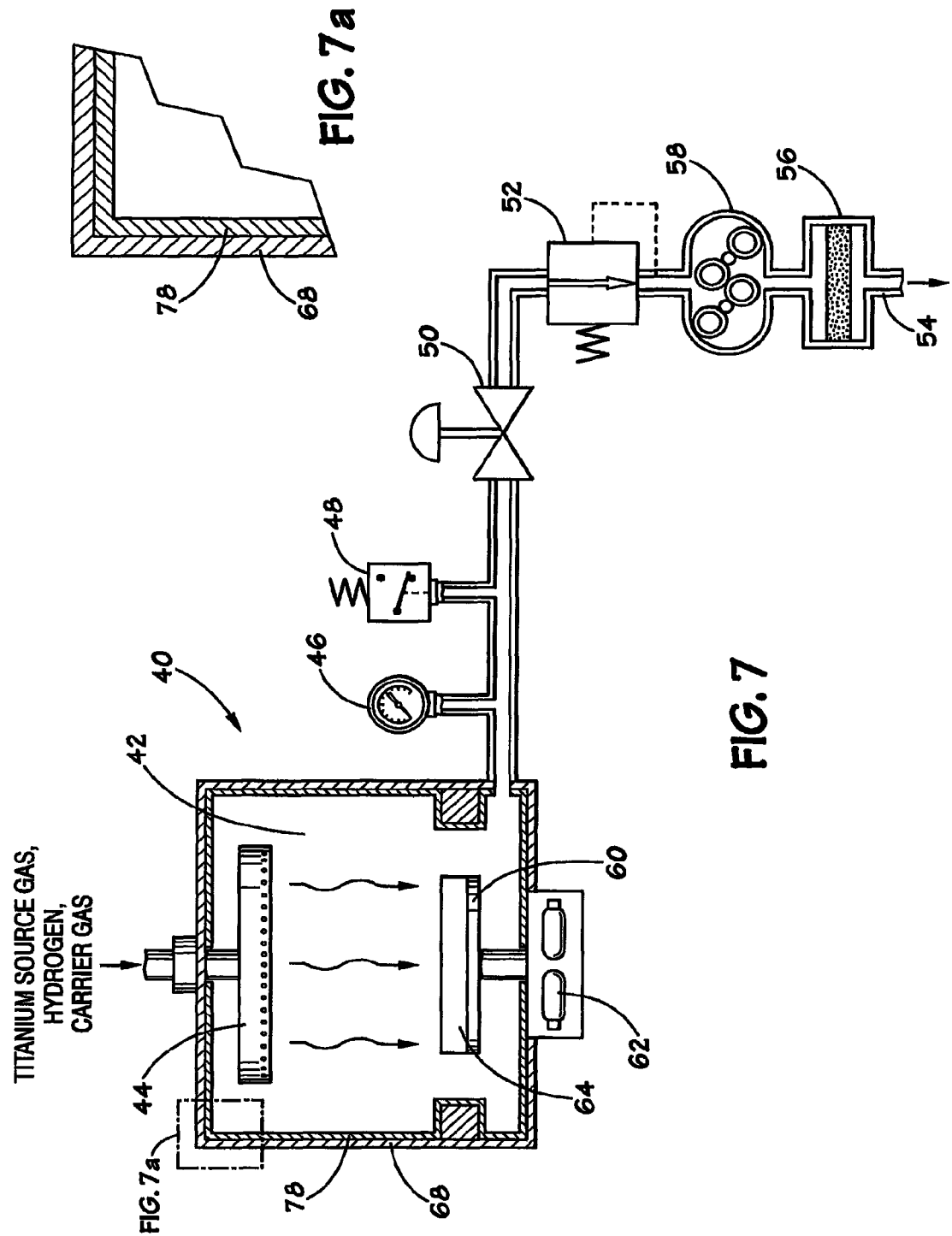

METHOD AND SYSTEM FOR BINDING HALIDE-BASED CONTAMINANTS

CROSS-REFERENCE TO RELATED APPLICATION

This application is a divisional of U.S. patent application Ser. No. 13/041,227, filed Mar. 4, 2011, which is a divisional of U.S. patent application Ser. No. 11/218,773, filed Sep. 1, 2005, now U.S. Pat. No. 7,922,818, which is a divisional of U.S. patent application Ser. No. 10/230,592, filed Aug. 29, 2002, now U.S. Pat. No. 7,311,942, which are all respectively incorporated herein by reference.

BACKGROUND OF THE INVENTION

1. Field of the Invention

This present invention relates generally to the field of integrated circuit manufacturing technology and, more specifically, to the deposition of titanium-containing films with low levels of chlorine contamination.

2. Description of the Related Art

This section is intended to introduce the reader to aspects of the art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In the manufacturing of integrated circuits, numerous microelectronic circuits are simultaneously manufactured on a semiconductor substrate. These substrates are usually referred to as wafers. A typical wafer is comprised of a number of different regions, known as die regions. When fabrication is complete, the wafer is cut along these die regions to form individual die. Each die contains at least one microelectronic circuit, which is typically replicated on each die. One example of a microelectronic circuit which can be fabricated in this way is a dynamic random access memory.

Although referred to as semiconductor devices, integrated circuits are in fact fabricated from numerous materials of varying electrical properties. These materials include insulators or dielectrics, such as silicon dioxide, and conductors, such as aluminum, tungsten, copper, and titanium in addition to semiconductors, such as silicon and germanium arsenide. By utilizing these various materials, the various transistors, gates, diodes, vias, resistors, and connective paths comprising the integrated circuit may be formed. Because of the complexity, both in materials and in design, incorporated into integrated circuits, the integrated circuit can be designed to perform a variety of functions within a limited space.

In integrating the performance of the diverse materials and functions comprising the semiconductor device, titanium-containing thin films or layers are commonly employed for various purposes. For example, it is often desirable to increase the conductivity between an enhanced, or doped, region of the wafer and a subsequently deposited conductive layer. One method of providing this increased conductivity involves depositing a thin titanium-containing film, such as titanium silicide, over the wafer so that it covers the enhanced region prior to deposition of the conductive layer.

Thin films of titanium-containing compounds have other uses as well in the fabrication of integrated circuits. These uses include the use of a thin layer of titanium nitride as a diffusion barrier to prevent chemical attack of the substrate, as well as to provide a good adhesive surface for the subsequent deposition of tungsten. In addition, titanium-containing thin films may be used to prevent interdiffusion between adjacent layers or to increase adhesion between adjacent layers. For example, thin films of titanium nitride, titanium silicide, and metallic titanium can be deposited to facilitate adhesion and to reduce interdiffusion between the layers of a semiconductor device. Other titanium-containing films that may be useful for these or other purposes include titanium boride, titanium boronitride, titanium tungsten, tantalum nitride, and the ternary alloy composed of titanium, aluminum, and nitrogen.

The deposition of titanium-containing films is just one example of a step in the manufacture of semiconductor wafers. Indeed, any number of thin films, insulators, semiconductors, and conductors may be deposited onto a wafer to fabricate an integrated circuit. Various deposition processes may be employed to deposit such thin films, but two common processes are chemical vapor deposition (CVD) and atomic layer deposition (ALD).

In CVD, the gas phase reduction of highly reactive chemicals under low pressure results in very uniform thin films. A basic CVD process used for depositing titanium or titanium-containing films involves a given composition of reactant gases and a diluent which are injected into a reactor containing one or more silicon wafers. The reactor is maintained at selected pressures and temperatures sufficient to initiate a reaction between the reactant gases. Plasma may also be introduced to enhance some deposition reactions, i.e. plasma enhanced CVD or PECVD. The reaction results in the deposition of a thin film on the wafer. If the gases include hydrogen and a titanium precursor, such as titanium tetrachloride, a titanium-containing film will be deposited. If, in addition to hydrogen and the titanium precursor, the reactor contains a sufficient quantity of nitrogen or a silane, the resulting titanium-containing film will be titanium nitride and titanium silicide respectively.

The ALD deposition process, also known as atomic layer chemical vapor deposition (ALCVD) is a refinement of the CVD process in which the deposition of a layer of material is controlled by a pre-deposited layer of a precursor. Using the ALD technique, layers as thin as one molecule may be deposited. The ALD technique provides complete step coverage and very good conformality.

Both the CVD and ALD techniques are useful for depositing titanium-containing thin films, typically using titanium tetrachloride as a precursor. Use of titanium tetrachloride, however, has the undesired consequence of producing chlorine and chloride byproducts, i.e. Cl and/or HCl, which may contaminate the titanium-containing thin film. In addition, the reaction chamber walls are typically contaminated by the chlorine-based byproducts. Because such byproducts are weakly bonded to the walls, the byproducts contaminate future reactions and products. This chlorine and chloride contamination is problematic since chlorine is known to affect the performance of the resulting semiconductor devices adversely either by impairing the functioning of the titanium-containing thin film or by poisoning or corroding adjacent metal layers by diffusion of the chlorine contaminant. In addition, the chlorine-based byproducts may corrode the reaction chamber itself, further impairing future deposition reactions and increasing maintenance time and costs associated with the chamber.

One current technique for reducing the degree of chlorine-based contamination is exposing the thin film to ammonia gas after deposition. This technique, however, does not remove all of the chlorine-based contamination from the thin film or from the reaction chamber and requires the introduction of an additional process. Another current technique for reducing chlorine-based contamination is to increase the deposition temperature to greater than 350° C. This technique also does not remove all of the chlorine-based contamination from the thin film or from the chamber. Increased deposition temperature has the additional disadvantages of adversely affecting previously deposited films and of producing thin films with poor step coverage which can increase the failure rates of the produced dies, i.e. higher deposition temperatures typically reduce the yield of acceptable semiconductor devices. Ideally, a technique for reducing the degree of chlorine-based contamination will reduce contamination during the deposition process, not subsequently, and will operate within the preferred temperature range for the deposition process.

BRIEF DESCRIPTION OF THE DRAWINGS

Advantages of the invention may become apparent upon reading the following detailed description and upon reference to the drawings in which:

FIG. 1 illustrates a block diagram of an exemplary processor-based device in accordance with the present technique;

FIG. 2 illustrates an exemplary memory sub-system in accordance with the present technique;

FIG. 3 illustrates an exemplary chemical vapor deposition or an atomic layer deposition chamber incorporating removable liners in accordance with the present technique;

FIG. 3a illustrates a close-up view of the reaction chamber walls and the removable liner of FIG. 3;

FIG. 7 illustrates an exemplary chemical vapor deposition or atomic layer deposition chamber utilizing an adsorptive coating in accordance with the present technique; and FIG. 7a depicts a close-up view of the reaction chamber wall and adsorptive coating of FIG. 7.

DETAILED DESCRIPTION OF SPECIFIC EMBODIMENTS

Figure 4:
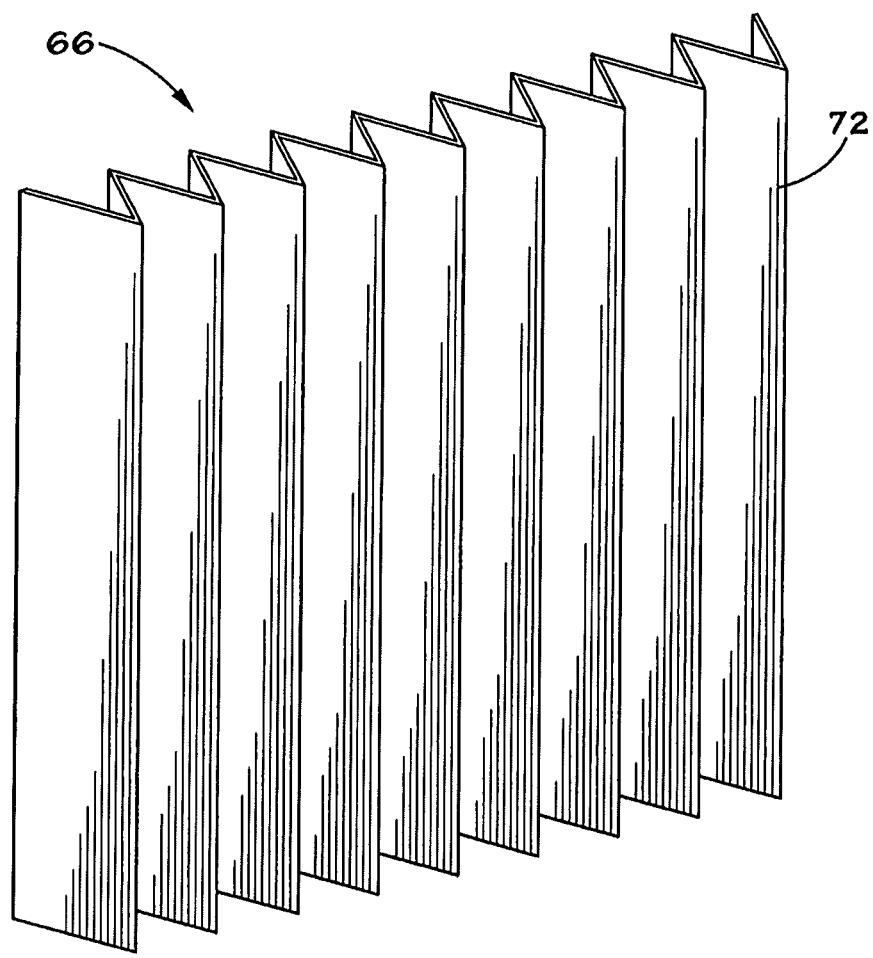
FIG. 4 depicts an exemplary corrugated removal liner in accordance with the present technique.

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors which share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a joystick, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

The processor 12 controls the functioning of the system 10 by implementing software programs. Generally, a memory sub-system, as described below in regard to FIG. 2, is coupled to the processor 12 to store and facilitate execution of various programs. For instance, the processor 12 may be coupled to the volatile memory 26 which may include Dynamic Random Access Memory (DRAM) and/or Static Random Access Memory (SRAM). The processor 12 may also be coupled to the non-volatile memory 28. The non-volatile memory 28 may include a read-only memory (ROM), such as an EPROM, and/or flash memory to be used in conjunction with the volatile memory or a high capacity memory such as a tape or disk drive memory. The size of the ROM is typically selected to be just large enough to store any necessary operating system, application programs, and fixed data. The volatile memory 26 on the other hand, is typically quite large so that it can store dynamically loaded applications and data.

A portion of the memory sub-system, such as the volatile memory 26, is depicted in FIG. 2. Generally, a memory controller 30 is generally provided to facilitate access to the storage devices. While the present embodiment illustrates the memory controller 30 as existing in the memory sub-system, the memory controller 30 may be in the processor 12 or may exist in a completely separate chip, as can be appreciated by those skilled in the art. The memory controller 30 may receive requests to access the memory devices via one or more processors, such as the processor 12, via peripheral devices, such as the peripheral device 24, and/or via other systems. As previously discussed, the memory controller 30 is generally tasked with facilitating the execution of the requests to the memory devices and coordinating the exchange of information, including configuration information, to and from the memory devices.

The memory sub-system may include a plurality of slots or ranks 32A-32H which are configured to operably couple a memory module, such as a dual-inline memory module (DIMM), to the memory controller 30 via one or more memory buses. Each DIMM generally includes a plurality of memory devices such as DRAM devices capable of storing data. The memory buses may include a memory data bus 34 to facilitate the exchange of data between each memory device and the memory controller 30. The volatile memory 26 also includes a command bus 36 on which address information such as command address (CA), row address select (RAS), column address select (CAS), write enable (WE), bank address (BA), and chip select (CS), for example, may be delivered for a corresponding request.

As one skilled in the art will recognize, various components of the system 10 and its associated memory sub-system, including the processor 12, the non-volatile memory 28, and the volatile memory 26, incorporate numerous semiconductor devices. These semiconductor devices, typically dies fabricated by applying assorted deposition and etching processes to a silicon wafer substrate, rely upon the integrity and purity of the particular layers of which they are composed to function properly. In a given semiconductor device, one or more of the integral layers may be a titanium-containing thin film which functions to enhance conductivity, to prevent interdiffusion, to facilitate adhesion between layers of the semiconductor device, etc. Impurities within the titanium-containing thin film may prevent the thin film from performing these functions properly and may thereby impair the functioning of the semiconductor device.

Impurities within the thin film include the byproducts of the deposition reaction used to deposit the titanium-containing thin film, typically chlorine and chloride. In particular, the titanium deposition reaction commonly uses titanium tetrachloride, $TiCl_4$, as a precursor that generates chlorine and chloride byproducts that contaminate both the titanium-containing thin film and the reaction chamber itself. Contamination of the reaction chamber allows for the contamination of future reaction products. Using the exemplary technique described in detail below, a layer of titanium or titanium-containing film is deposited upon a wafer such that chlorine and chloride contamination of the film and of the reaction chamber is significantly reduced.

To perform the deposition of the titanium-containing thin film, a CVD or ALD reactor 40 is advantageously used, as illustrated in FIG. 3. Hydrogen and a titanium source gas, typically a titanium halide such as titanium tetrachloride, titanium tetrabromide, or titanium tetraiodide, are introduced into the reaction chamber 42 through a shower head 44. If desired, a carrier gas, such as argon or helium, may be added to the reactant gases. The gases may or may not be pre-mixed. The gases are generally introduced through the shower head 44 to achieve good dispersion of the gases, but the gases can be introduced by other means.

Desired reaction pressures are maintained by conventional pressure control components, including a pressure sensor 46, a pressure switch 48, an air operating vacuum valve 50, and a pressure control valve 52. The carrier gas and the byproduct gas given off during the reaction escapes from the reaction chamber 42 through an exhaust vent 54. These gases pass through a particulate filter 56, and gas removal may be facilitated by a roots blower 58.

In the reactor chamber 42, a substrate holder 60 is heated to a temperature of less than 700° C. In fact, temperatures may be in the range of 200 to 400° C., with pressures in the range of 0.1 to 6.0 Torr. Heating may be achieved through the use of halogen lamps 62, so that the silicon wafer 64 is heated by convection. Plasma may also be introduced into the reactor chamber 42 to enhance certain deposition reactions, i.e. PECVD, such as those reactions for depositing Ti or $TiSi_x$.

As a result of this process, a chemical reaction occurs which results in the deposition of a titanium-containing film along the exposed surfaces of the wafer 64. The thin films which are typically deposited by this process are generally less than 3000 Å thick and generally deposited during an exposure period greater than 200 seconds. In a deposition process where titanium tetrachloride is employed as the titanium precursor, the reaction can be characterized as $TiCl_4+2(H_2) \rightarrow Ti+4(HCl)$. As mentioned above, the titanium-based reaction may be modified to employ other halides as the titanium source gas, such as titanium tetrabromide or titanium tetraiodide, instead of titanium tetrachloride. The chemical reaction in those instances can be characterized as $TiBr_4$ (or $TiI_4$)$+2(H_2) \rightarrow Ti+4(HBr)$ (or $4(HI)$).

Optionally, a reducing agent can be introduced into the reaction chamber 42 along with the titanium precursor and hydrogen. When this reducing agent is ammonia, the titanium-containing film which is deposited onto the wafer 64 is composed principally of titanium nitride, and the reaction can be characterized by $6(TiCl_4)+8(NH_3) \rightarrow 6(TiN)+N_2+24(HCl)$ at temperatures between 400° C. and 700° C. When the reducing agent is a silane, the titanium containing film which is deposited onto the wafer 64 is composed principally of elemental titanium and titanium silicide, and the reaction can be characterized by $3(TiCl_4)+2(H_2)+2(SiH_4) \rightarrow 2(Ti)+TiSi_2+12(HCl)$. Various other titanium-based reactions using similar titanium precursors will be known to those skilled in the art for depositing other titanium containing thin films, such as those comprising titanium boride and titanium boronitride.

While these assorted titanium-based reaction are effective for depositing titanium-containing films, the byproducts of the deposition reactions, typically chlorides, such as HCl, and chlorine from incomplete reactions, contaminate the deposited thin film. The resulting contamination may compromise the effectiveness of the titanium-containing thin film as a barrier or conductor, or the chlorine or chloride may diffuse out to contaminate layers adjacent to the titanium-containing thin film. Either of these consequences of contamination may adversely affect the function of the semiconductor device. Additionally the chlorine and chloride byproducts continue to contaminate the reaction chamber 42 after the deposition reaction, thereby contaminating future deposition reactions and products.

To reduce or limit the effects of this chlorine-based contamination, it is therefore desirable to remove or adsorb the chlorine and chloride byproducts during the deposition process to prevent the contamination of the thin layer product. To this end, it is desirable to include within the reaction chamber 42 a component composed of a material that has a greater affinity for chlorine and/or chlorides than the titanium-containing thin film and those films comprising the remainder of the device. Such high affinity materials include, but are not limited to carbon, silicon, manganese, group I or group II elements, amines (such as pyridine), phosphines, and other Lewis bases. Such an adsorptive component may thereby remove chlorine and/or chloride from the reaction area and thereby reduce the amount of chlorine and chloride contamination. For instance, one possibility would be to construct or coat a component of the reaction chamber 42, such as the shower head 44 or the substrate holder 60, with such an adsorptive material. Thus constructed or coated, the shower head 44 and substrate holder 60 are examples of components of the reaction chamber 42 that may be referred to as solid material. Another possibility would be to dispose a removable component or device composed of such a material within the reaction chamber 42. In some instances, the high affinity material, such as manganese, carbon or silicon, may be heated to a temperature higher than that of the reaction chamber 42 in order to increase the oxidation reaction rate of these materials with halogen byproducts, thereby enhancing their adsorption rate.

Referring once again to FIG. 3, such a removable component is depicted in the form of removable liners 66 secured to the walls 68 of the reaction chamber 42. Fasteners 70 may be employed to secure the removable liners 66 and may be integral or separate from the walls 68 or the removable liner 66 and may constitute hooks, clips, screws, or any other type fastener capable of securing the removable liner 66 to the reaction chamber walls 68. A close-up of the association of the removable liner 66, the fastener 70 and the reaction chamber wall 68 is shown in FIG. 3*a*, representing the region of FIG. 3 outlined by the dotted line.

The removable liners 66 are at least partly composed of a material that has a greater affinity for chlorine and/or chlorides than the titanium-containing thin film and those films comprising the remainder of the device. For example, the removable liner 66 may be composed, at least in part, of the carbon, silicon, manganese, group I or group II elements, or amine. These adsorptive materials, whether incorporated into a removable liner 66 or a component of the reactor 40, act to pull the chlorine out of the gas phase, thereby reducing the amount of chlorine available to contaminate the titanium-containing thin layer. Where carbon, manganese or silicon is used as the removable liner 66 or component of the reactor 40, these materials may be heated to a temperature greater than that of the reaction chamber in order to increase their adsorption rate of chlorine or other halogens.

For example, if an amine, such as pyridine, is chemically bonded to the surface of the removable liner 66, the amine will adsorb chlorides, such as HCl, to form amine hydrochloride salts. The amine may be chemically attached to a substrate, such as a zeolite which will be the surface of the removable liner 66 or other component of the reactor 40. Carbon also will bind free chlorine and may comprise the removable liner 66 or a portion of the liner. Manganese may be used to coat the removable liner 66 and will form stable halide with free chlorine. However, at the temperatures and pressures typical of titanium-containing thin film deposition reactions, manganese does not react with chlorine.

Figure 6:
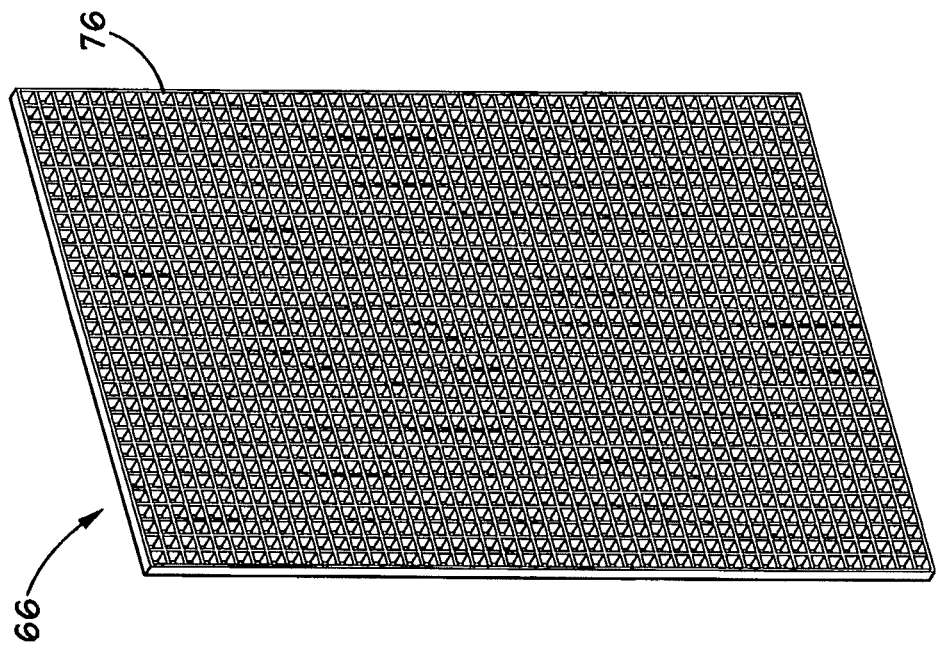
FIG. 6 depicts an exemplary mesh removable liner in accordance with the present technique.
Figure 5:
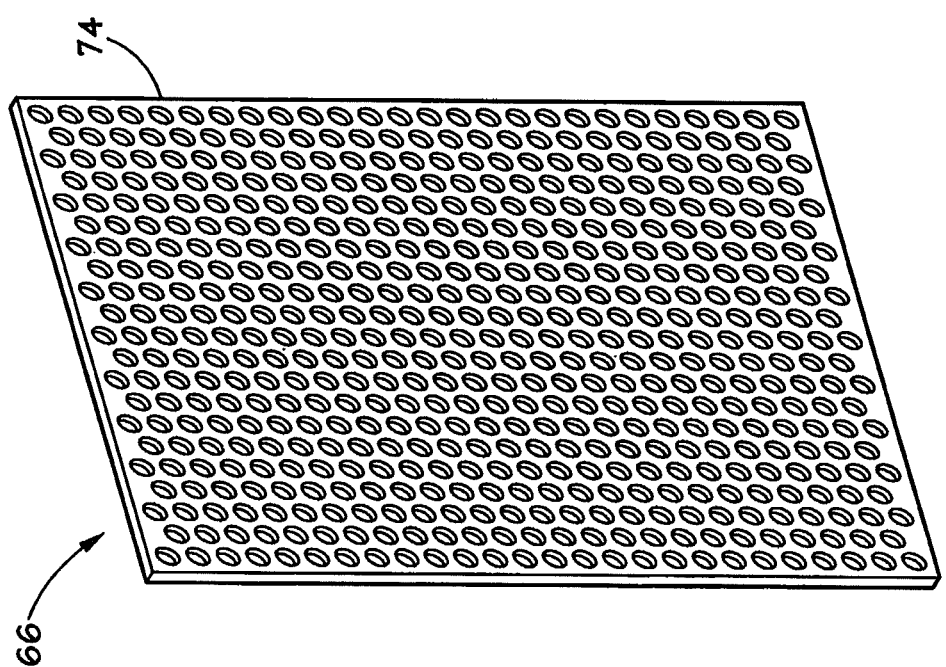
FIG. 5 depicts an exemplary porous removable liner in accordance with the present technique.

One consideration in designing an adsorptive component, including the removable liner 66, is that the component may be desired to provide sufficient surface area to provide adsorption and removal of chlorine and chlorides for a useful time period. In the case of a removable component, such as the liner 66, it may be desirable to be able to leave the removable liner 66 in place within the reaction chamber 42 for a minimum of a week and preferably for a month or longer. Numerous configurations of the removable liner 66 may be employed to increase the surface area of the removable liner 66 to provide the type of duration envisioned. For example, referring now to FIG. 4, a corrugated liner 72 is depicted which effectively increases surface area to lengthen the period that the removable liner 66 may be left in the reaction chamber 42. The depth, pitch, number, and texture of the corrugations of the corrugated liner 72 may be modified to increase its effective surface area. Alternately, referring now to FIG. 5, a porous liner 74 with perforations is depicted. The circumference, depth and number of the pores of the porous liner 74 may be adjusted to provide increased effective surface area. Referring now to FIG. 6, a mesh liner 76 is depicted which also acts to increase the effective surface area presented within the reaction chamber 42. The spacing, thickness, and depth of the mesh of the mesh liner 76 may be modified to increase the effective surface area of the removable liner 66. The removable liner 66, corrugated liner 72, porous liner 74, and mesh liner 76 are examples of solid material components of the reaction chamber 42.

As will be recognized by those skilled in the art, various other modifications may be made to the removable liners 66 discussed above, i.e. corrugated, porous, and mesh, to increase their effective surface areas. Likewise other configurations of the removable liner 66 may be employed which also provide an enhanced surface area. The discussion of corrugated, porous, and mesh configurations of the removable liner 66 is merely demonstrative and is not intended as an exhaustive list of possible modifications for increasing surface area. Any removable component performing the chlorine and/or chloride adsorptive functions described above may be used in the present technique, regardless of whether the surface area of such a component is increased or in what manner the surface area of such a component is increased.

An alternative to employing a removable liner 66 or other removable component is depicted in FIG. 7. In FIG. 7, an adsorptive coating 78 is applied to the interior wall 68 of the reaction chamber 42. Unlike the removable liner 66, the adsorptive coating 78 is intended to remain within the chamber indefinitely. A close-up view of the adsorptive coating 78 and its configuration with the reaction chamber wall 68 can be seen in FIG. 7*a*, representing the portion of FIG. 7 outlined by the dotted line. The adsorptive coating 78 may comprise the same materials discussed above and may be applied so that it possesses a roughened texture to increase the available surface area for adsorption of chlorine-based contaminants.

After a period of use, the removable liner 66, the adsorptive coating 78, or any other adsorptive components employed may be regenerated to restore their adsorptive capacity. Such regeneration may include heating the removable liner 66, the adsorptive coating 78, or other component to a sufficiently high enough temperature to free chlorine-based contaminants, which may then be flushed out of the reaction chamber. Silicon based adsorptive materials, whether employed in a removable liner 66, an adsorptive coating 78, or another component, may be regenerated by etching off the titanium silicide or titanium nitride which will form on the silicon. By means of these regenerative processes, the removable liner 66, the adsorptive coating 78, or the other adsorptive components may be used to reduce chlorine-based contamination for an extended period.

Use of these chlorine adsorptive components discussed above reduces chlorine and chloride contamination of the reaction chamber 42 and of the titanium-containing film product by one to two orders of magnitude. Prior to this technique, chlorine-based contamination levels might be as high as 10% chlorine in the deposited titanium-containing films and are never less than 2% to 3% in the deposition temperature range of 200° C. to 350° C. Use of these adsorptive structures, however, reduces chlorine-based contamination to levels of 0.1% to 1% chlorine in a titanium-containing film deposited in the temperature range of 200° C. to 350° C. Further, use of these chlorine-adsorbing components should work for any ALD or CVD based deposition of metal halides where a low halide content is desired in the deposited film. In other words, the materials discussed above should attract other halides, such as fluorine as well as chlorine. Therefore, if reactant gases such as $TaF_5$ or $WF_6$ are used, for example, the removable liner 66 or the adsorptive coating 78 will attract fluorine or halide-based contaminants as well.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of producing a semiconductor circuit, comprising:
   introducing hydrogen and titanium source gas into the deposition chamber such that a chemical reaction occurs that results in deposition of a titanium-based film on a silicon wafer within the deposition chamber, wherein the chemical reaction produces halide-based contaminants; and
   adsorbing a sufficient amount of the halide-based contaminants with a solid material disposed within and coupled to the deposition chamber such that the titanium-based film has a halide-based contaminant content of less than 1%.

2. The method of claim 1, comprising introducing plasma into the deposition chamber.

3. The method of claim 1, comprising introducing a reducing agent into the deposition chamber.

4. The method of claim 1, comprising retaining the solid material on a wall of the deposition chamber with a fastener.

5. The method of claim 1, comprising heating the solid material to a temperature greater than a deposition reaction temperature.

6. The method of claim 1, comprising depositing and etching layers on the silicon wafer to produce circuit features.

7. A method, comprising:
   adsorbing a halide-based contaminant in a deposition chamber with a material having a greater affinity for the halide-based contaminant than a titanium-based film for a semiconductor circuit, wherein the titanium-based film is disposed in the deposition chamber; and
   limiting a halide-based contaminant content of the titanium-based film to less than 1% due to the adsorbing of the halide-based contaminant by the material having the greater affinity for the halide-based contaminant than the titanium-based film.

8. The method of claim 7, comprising retaining the material within the deposition chamber via a fastener.

9. The method of claim 7, comprising cleaning the deposition chamber by regenerating the material by heating the material to release adsorbed chlorine, wherein the material is chlorine-adsorbing material.

10. The method of claim 7, comprising cleaning the deposition chamber by regenerating the material by heating the material to release adsorbed chlorides or constituent elements of the chlorides, wherein the material is chloride-adsorbing material.

11. The method of claim 7, comprising cleaning the deposition chamber by regenerating the material by etching off a layer formed on the material, wherein the material is a silicon-based chlorine adsorbing material.

* * * * *